United States Patent
Yadav et al.

(10) Patent No.: US 8,362,613 B2
(45) Date of Patent: Jan. 29, 2013

(54) FLIP CHIP DEVICE HAVING SIMPLIFIED ROUTING

(75) Inventors: Anil Yadav, Greater Noida (IN); Sanjeev Kumar Jain, Greater Noida (IN); Rajesh Bajaj, Greater Noida (IN)

(73) Assignee: STMicroelectronics Pvt Ltd., Uttar Pradesh (IN)

( * ) Notice: Subject to any disclaimer, the term of this patent is extended or adjusted under 35 U.S.C. 154(b) by 113 days.

(21) Appl. No.: 12/982,168

(22) Filed: Dec. 30, 2010

(65) Prior Publication Data

US 2012/0168934 A1 Jul. 5, 2012

(51) Int. Cl.
*H01L 23/485* (2006.01)
*H01L 21/441* (2006.01)

(52) U.S. Cl. ......... 257/737; 257/E23.021; 257/E21.477; 257/620; 257/48; 257/691; 257/203; 257/207; 257/208; 257/211; 257/738; 257/784; 257/786; 257/700; 257/701; 257/E23.011

(58) Field of Classification Search .............. 257/737, 257/738, 734, 620, 48, E22.011, E21.214, 257/774, 773, 784, 786, 700, 701, 691, 203, 257/207, 208, 211, E2.011; 438/106, 113, 438/462, 689
See application file for complete search history.

(56) References Cited

U.S. PATENT DOCUMENTS

| | | | | | |
|---|---|---|---|---|---|
| 5,383,269 | A | * | 1/1995 | Rathmell et al. | 29/830 |
| 8,125,054 | B2 | * | 2/2012 | West et al. | 257/620 |
| 2008/0225502 | A1 | * | 9/2008 | Brown | 361/772 |
| 2012/0074579 | A1 | * | 3/2012 | Su et al. | 257/774 |

OTHER PUBLICATIONS

Fang, J.-W. et al., "A Network-Flow-Based RDL Routing Algorithmz for Flip-Chip Design," IEEE Transactions on Computer-Aided Design of Integrated Circuits and Systems 26(8):1417-1429, Aug. 2007.

Fang, J.-W. et al., "Area-I/O Flip-Chip Routing for Chip-Package Co-Design," ICCAD '08, Proceedings of the 2008 IEEE/ACM International Conference on Computer-Aided Design, San Jose, California, Nov. 10-13, 2008, pp. 518-522.

* cited by examiner

Primary Examiner — A O Williams
(74) Attorney, Agent, or Firm — Seep IP Law Group PLLC

(57) ABSTRACT

The present disclosure is directed to a semiconductor die having a chip outline boundary, a die seal, a row of input/output contact pads separated from the chip outline boundary by the die seal, a first row of solder bump connections positioned between the row of input/output contact pads and the die seal, and a second row of solder bump connections separated from the first row of solder bump connections by the row of input/output contact pads.

17 Claims, 8 Drawing Sheets

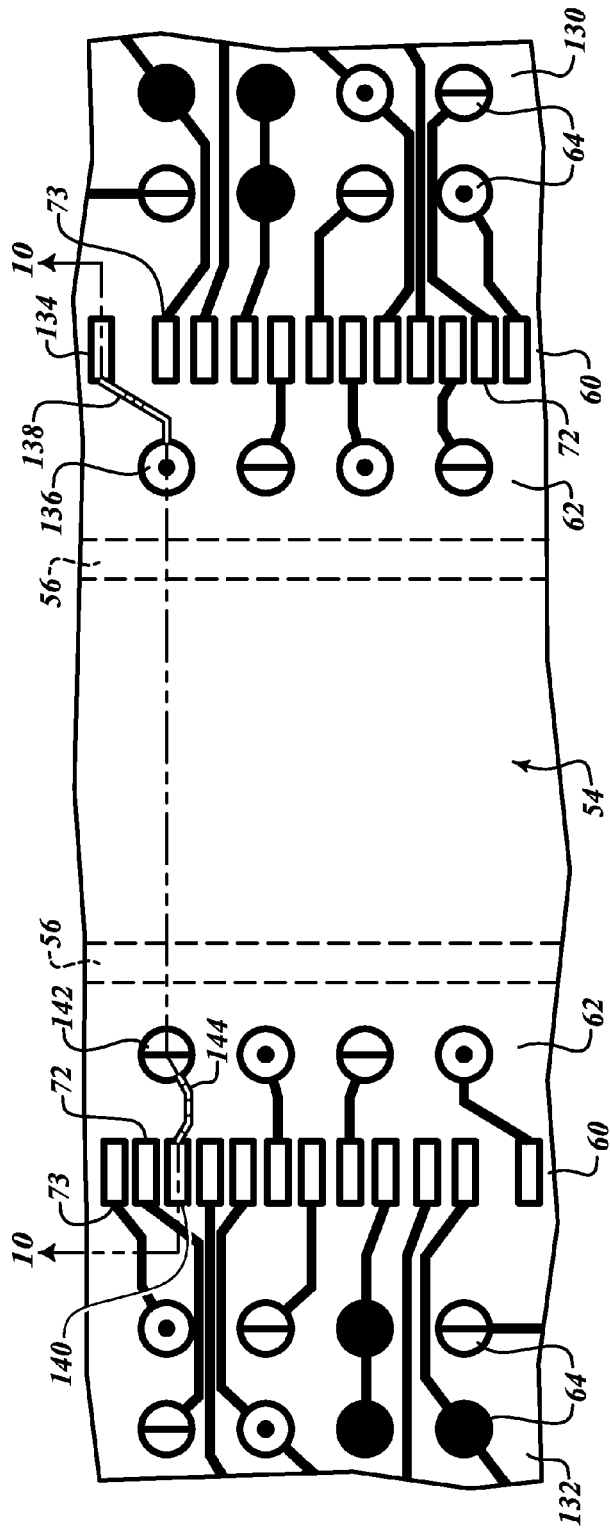
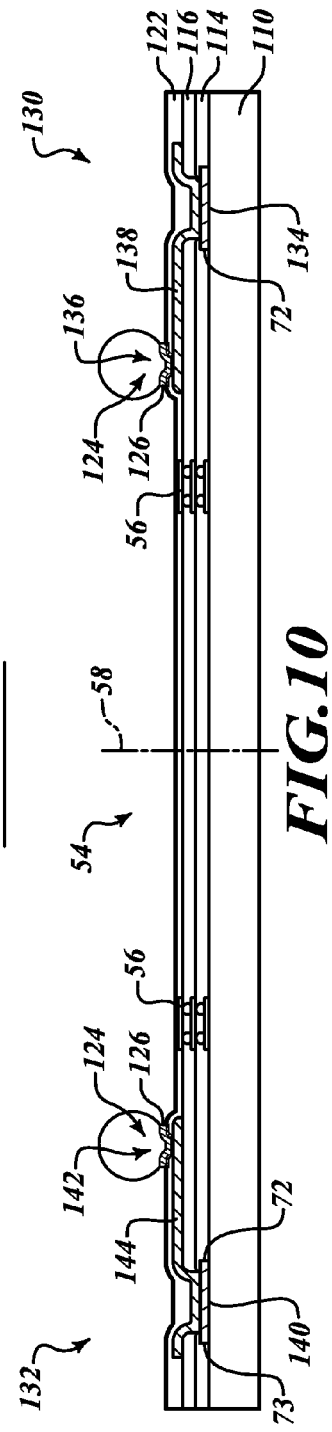
*FIG.9*
*FIG.10*

FLIP CHIP DEVICE HAVING SIMPLIFIED ROUTING

BACKGROUND

1. Technical Field

The present disclosure is directed to a flip chip device having simplified routing demands, and more particularly, to a die having a first plurality of bump pads between a die seal and a plurality of input/output contact pads.

2. Description of the Related Art

FIG. 1 is a first die 20 having a plurality of solder bumps 22 formed in an array 24 within an internal edge 25 of a plurality of contact pads 26 in a known flip-chip design. Flip chip is a method of electrically connecting the first die 20 to a package carrier, which is either a substrate or a lead frame. This method addresses problems that arise from higher integration density and rising power consumption. Flip chip is particularly beneficial for high speed applications and has the following advantages: reduced signal inductance, reduced power and ground inductance, reduced package footprint, smaller die size, shorter wire lengths, higher signal density, and lower thermal effects.

The first die 20 has a chip outline boundary 28 that is spaced from an external edge 30 of the contact pads 26 by an area 32. The chip outline boundary 28 is formed when the first die 20 is separated from adjacent die on a wafer (not shown). The area 32 from the chip outline boundary 28 to the external edge 30 is between 100 and 150 microns. This area 32 contains test structures and mechanical support structures that prevent the functional circuits and the contact pads 26 from being damaged when the die are separated. The area 32 does not include any operational circuit structures and is considered wasted space.

The first die 20 is 6860 microns by 7100 microns and includes 9 rows of solder bumps 22 extending inward from each internal edge 25. The solder bumps 22 of the array 24 are spaced at the absolute minimum spacing in order to have these desired dimensions. All of the solder bumps 22 are formed within the interior edge 25 of the contact pads 26. Routing is challenging with this flip chip arrangement especially at the corners, where there are 81 solder pads 22 tightly packed together. In particular, routing lines (see FIG. 2) for power and ground solder pads face issues when formed too close together. The density of the solder pads 22 at the corners is problematic, causing signal quality issues.

FIG. 2 is an enhanced view of a known arrangement of a plurality of routing lines 40 coupling a plurality of solder bumps 42 to a plurality of contact pads 44 in a second die 46. Although not identical to the solder bump arrangement of FIG. 1, both the first and the second die, 20, 46 have routing challenges in corners, such as corner 48. To address the routing issues in the corner, the second die reduces the number of solder bumps 42 as compared to the solder bumps 22 of the first die 20.

In order to avoid cross-talk or other noise, the routing lines 40 are painstakingly designed to adequately connect the interior most solder bumps 42 to the contact pads 44 in the corner 48. For example, a first solder bump 42a is coupled to a first contact pad 44a through an intricate routing pattern 40a and through a second solder bump 42b. The routing lines 40 are formed in a redistribution layer, which may be formed on a top or a bottom side of the die 46.

In addition, to achieve high speed performance a length of the routing lines must be precise and shorter distances are preferred. If there are more than two rows of active or signal carrying bump pads, the routing pitch becomes an issue. Ensuring that the routing lines can get to internal bumps without signal degradation becomes challenging, especially for high speed bus requirements with tight timing specifications that require that all routing lines heading to the internal bumps to be the same length. As the routing line length increases, the risk of voltage drop also increases. A way to address the voltage drop is to make the routing lines wider, however, this is limited by the minimum spacing of the bump pads unless the overall dimension of the die are increased.

BRIEF SUMMARY

The present disclosure is directed to a semiconductor die that includes a first plurality of bump pads positioned between a plurality of input/output contact pads and a die seal. The semiconductor die also includes a second plurality of bump pads spaced from the first plurality of bump pads by the input/output contact pads.

Providing the bump pads on each side of the input/output contact pads increases the number of bump pads in close proximity to the input/output contact pads, which results in shorter routing line length. This also decreases a density of the second plurality of bump pads, which are positioned interior to the input/output contact pads. This reduced density allows for wider routing lines into the interior of the die.

In one embodiment, there is a die having a chip outline boundary, a die seal, a row of input/output contact pads separated from the chip outline boundary by the die seal, a first row of solder bump connections positioned between the row of input/output contact pads and the die seal, and a second row of solder bump connections separated from the first row of solder bump connections by the row of input/output contact pads.

BRIEF DESCRIPTION OF THE SEVERAL VIEWS OF THE DRAWINGS

The foregoing and other features and advantages of the present disclosure will be more readily appreciated as the same become better understood from the following detailed description when taken in conjunction with the accompanying drawings.

FIG. 9 is an enhanced view of a scribe line between two die from the wafer of FIG. 3; and FIG. 10 is a cross-sectional view of two opposing I/O pads and bump pads of the two die of FIG. 9.

DETAILED DESCRIPTION

Figure 1:
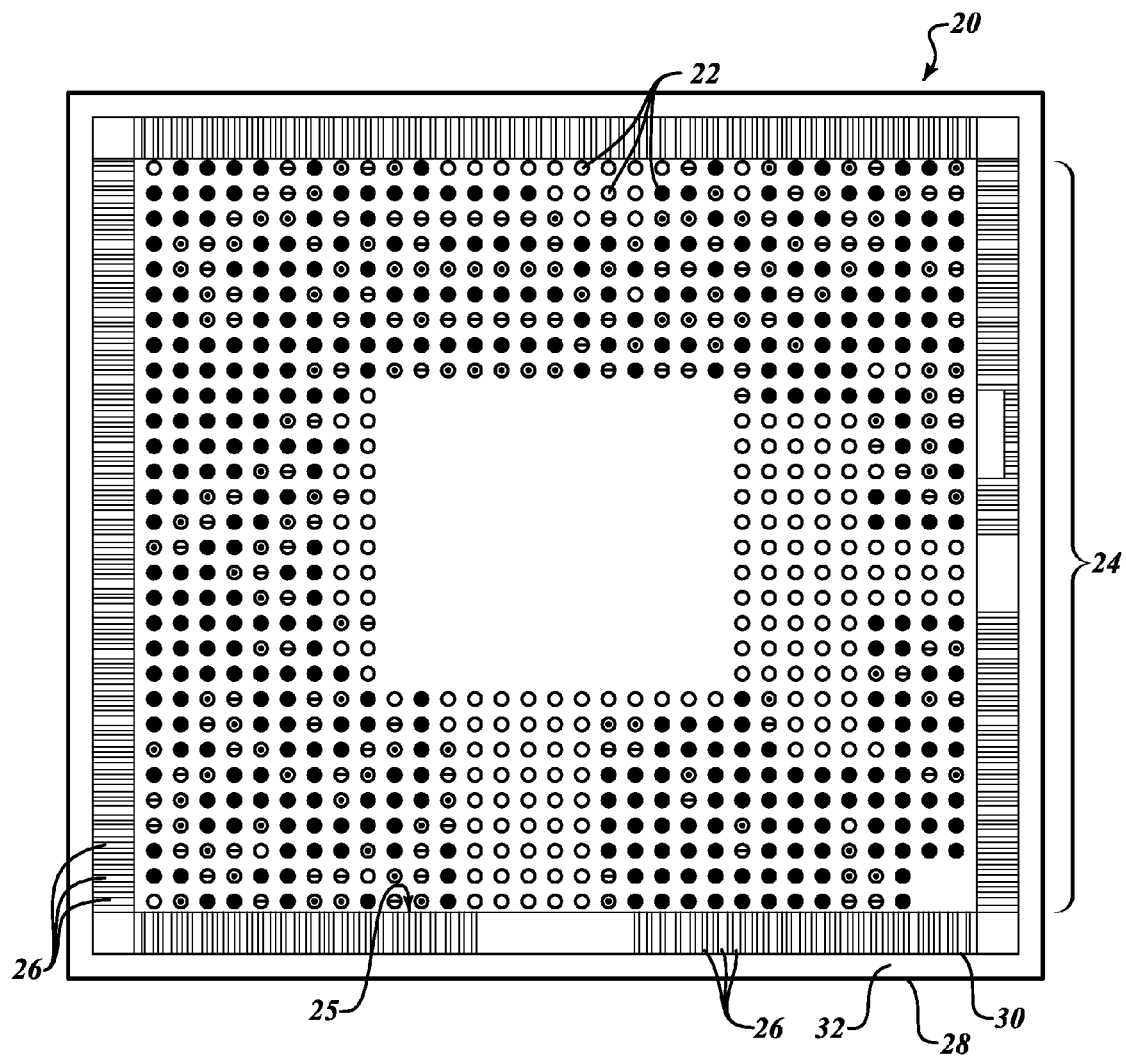
FIG. 1 is a die with a known flip chip arrangement.
Figure 2:
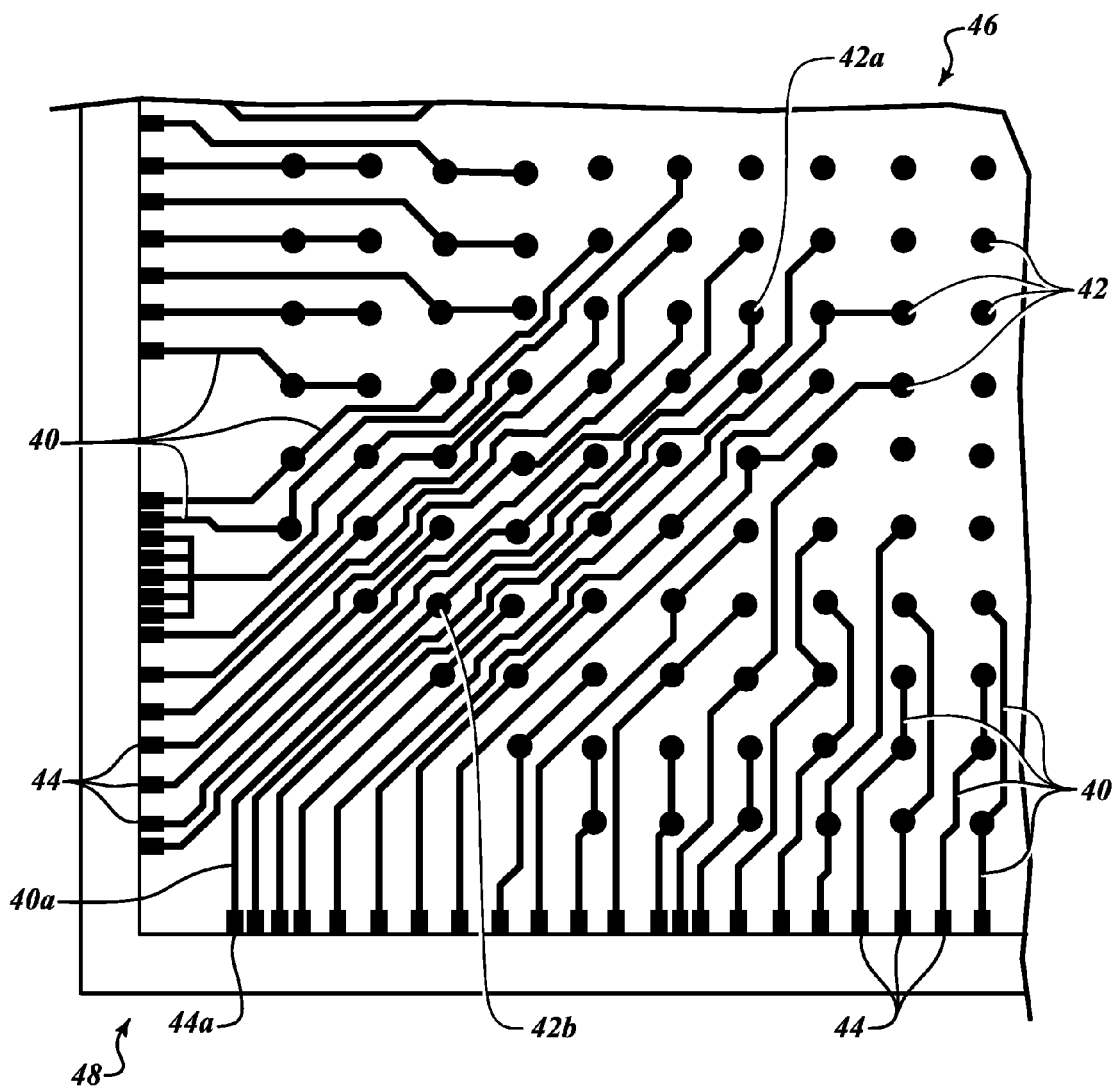
FIG. 2 is an enhanced view of a corner of another die in a know flip chip arrangement.

In the following description, certain specific details are set forth in order to provide a thorough understanding of various embodiments of the disclosure. However, one skilled in the art will understand that the disclosure may be practiced without these specific details. In some instances, well-known structures associated with the manufacturing of semiconductor wafers have not been described in detail to avoid obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the drawings, identical reference numbers identify similar features or elements. The size and relative positions of features in the drawings are not necessarily drawn to scale.

Figure 3:
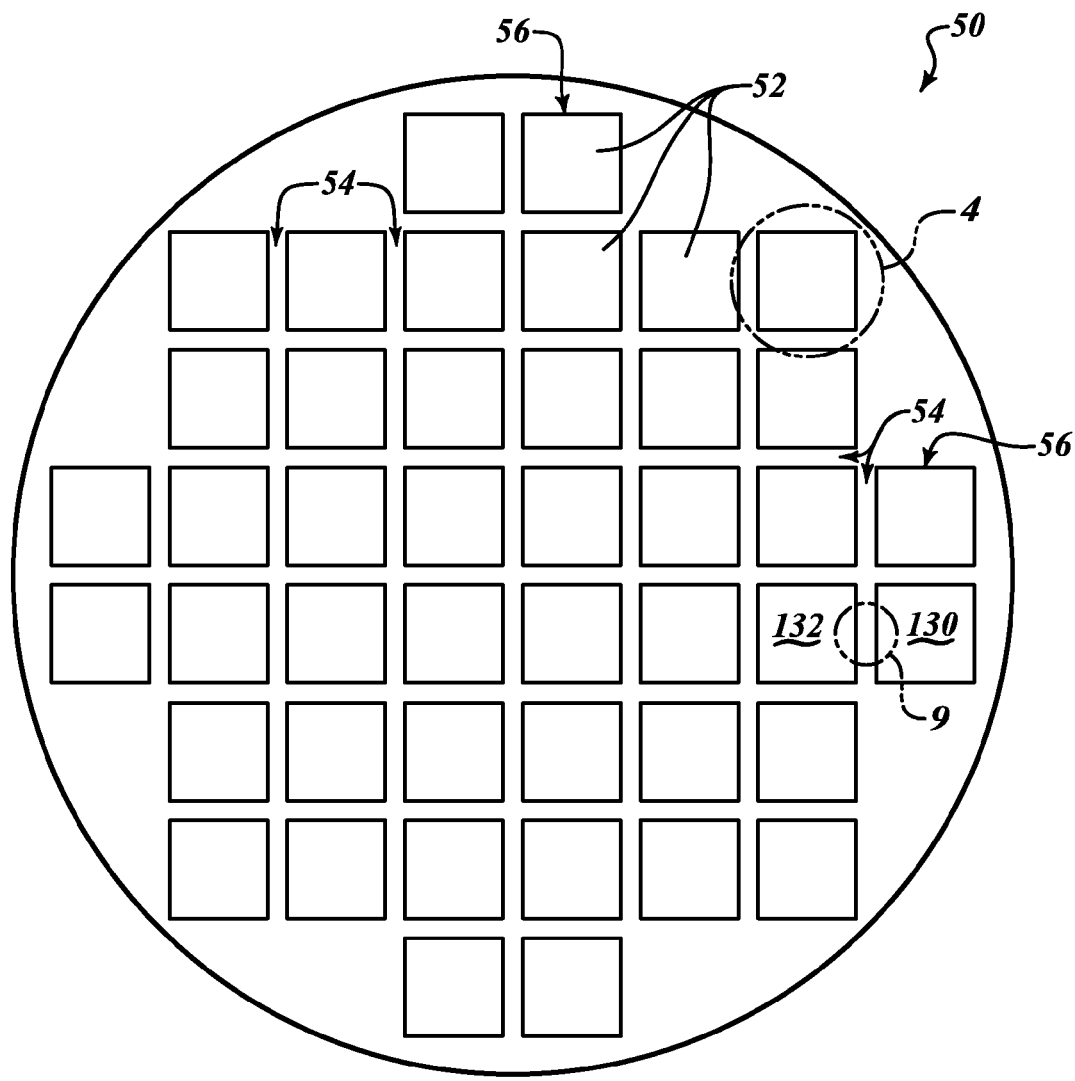
FIG. 3 is a plan view of a wafer having a plurality of die formed in accordance with an embodiment of the present disclosure.

FIG. 3 is a top plan view of a wafer 50 having a plurality of die 52 formed thereon. A plurality of scribe lanes 54 separates the plurality of die 52 from each other. Each die 52 has a die seal 56 that indicates an edge of operational components.

Figure 4:
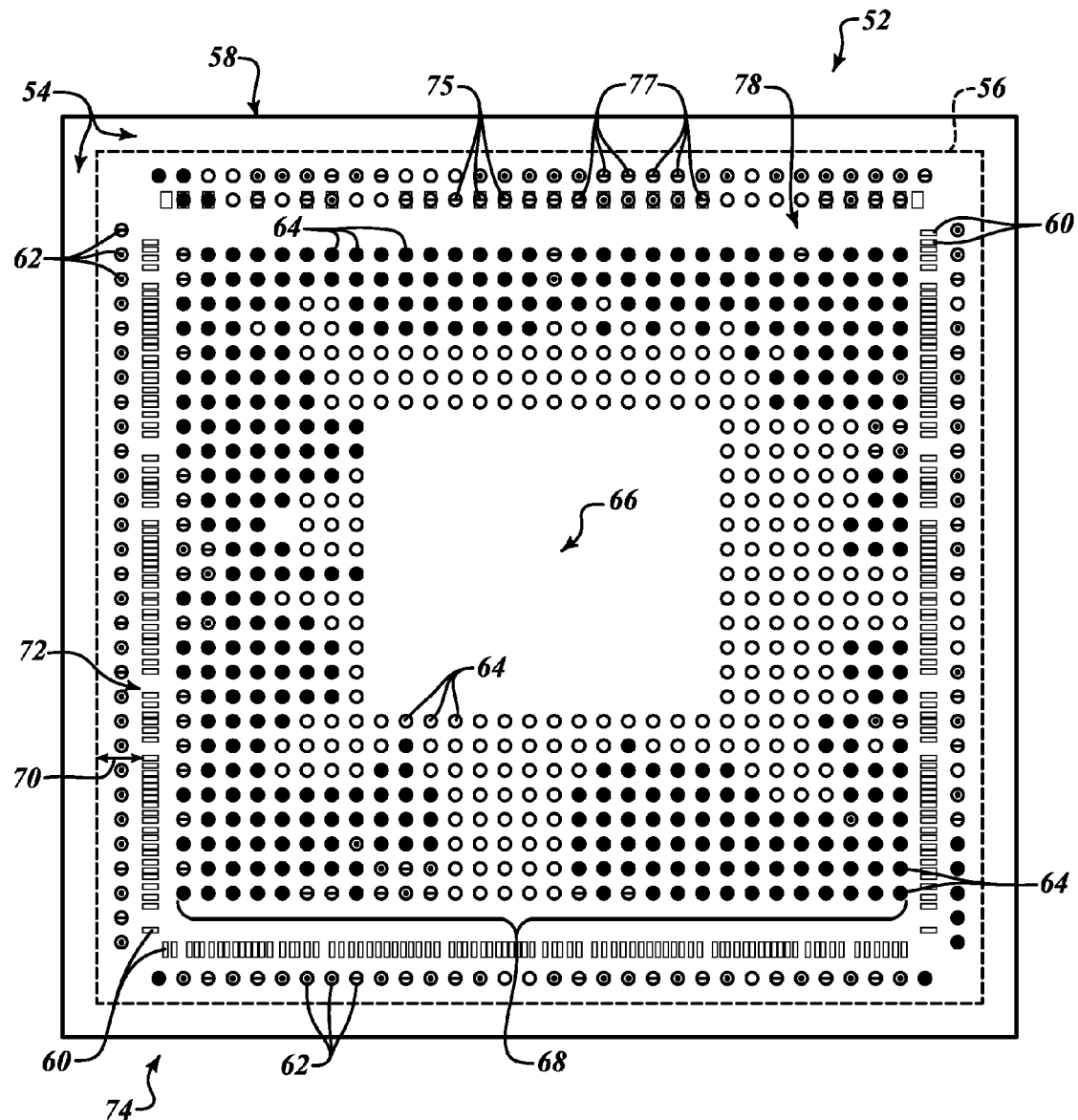
FIG. 4 is an enhanced view of one of the die of FIG. 3 having a row of bump pads between a chip outline boundary and a plurality of I/O pads.

FIG. 4 is an enhanced view of one of the die 52 from the wafer 50 of FIG. 3. The die 52 has a peripheral input/output flip chip arrangement. The die 52 are separated by cutting through the scribe lanes 54, which forms a chip outline boundary 58. The die seal 56 is spaced from the chip outline boundary 58 by what remains of the scribe lanes 54, hereinafter referred to as the scribe lane 54. Although the scribe lanes 54 include test structures for use prior to dicing, the scribe lanes 54 do not include any operational circuit structures in the final die 52.

The die 52 also includes a plurality of input/output (I/O) pads 60 arranged linearly around a periphery of the die 52. A first plurality of bump pads 62 are positioned between the die seal 56 and the I/O pads 60. A second plurality of bump pads 64 are formed between the I/O pads 60 and a center region 66 of the die 52. The second plurality of bump pads 64 are arranged in an array 68 that includes 8 rows of the second plurality of bump pads 64.

In one embodiment, an existing die layout that does not have the first plurality of bump pads 62 outside of the I/O pads 60 is modified to receive the first plurality of bump pads 62. A first distance 70 between the die seal 56 and an exterior edge 72 is increased to accommodate the first plurality of bump pads 62. The first distance 70 may be 20 to 30 microns larger than in the prior die layout. In other words, accommodating the first plurality of bumps pads 62 adds approximately 40 microns to a length and a width of the die layout. For example, modifying the known die arrangement of FIG. 1 would change the dimensions of the first die 20 from 6860 microns by 7100 microns to 6880 microns by 7120 microns.

Adding the additional 20 to 30 microns to accommodate the first plurality of bump pads 62 does not significantly increase the overall dimensions of the die 52. This is because the already existing wasted space is already close to having enough space to accommodate the row of bump pads and is only short by 10 to 15 microns. Adding 20 to 30 microns extends the distance needed 10 to 15 microns and also includes slight buffer. Adding two rows outside of the I/O pads 60 would significantly increase the dimensions due to the minimum spacing between bump pads and other design rule spacing.

In one embodiment, a minimum spacing of the second plurality of bump pads 64 in the array 68 is in the range of 200 and 220 millimeters. By moving the first plurality of bump pads 62 to be between the die seal 56 and the exterior edge 72 of the I/O pads 60 the array 68 of the second plurality of bump pads 64 may become less dense. Instead of spacing the second plurality of bump pads 64 by a distance greater than the minimum spacing, the overall dimensions of the die 52 may be reduced while maintaining the minimum spacing. Even with the addition of 20 microns to the first distance 70, the overall dimensions may be reduced. In one embodiment, the dimensions of the die 52 are 6660 microns by 6900 microns. Thus, even though the bumps pads are added outside of the normal positions of the bond pads, the ability to free of space in the central regions may, in some cases, result in an overall smaller die, while in other cases, it may become larger by about 20-30 microns in each dimension.

Figure 5:
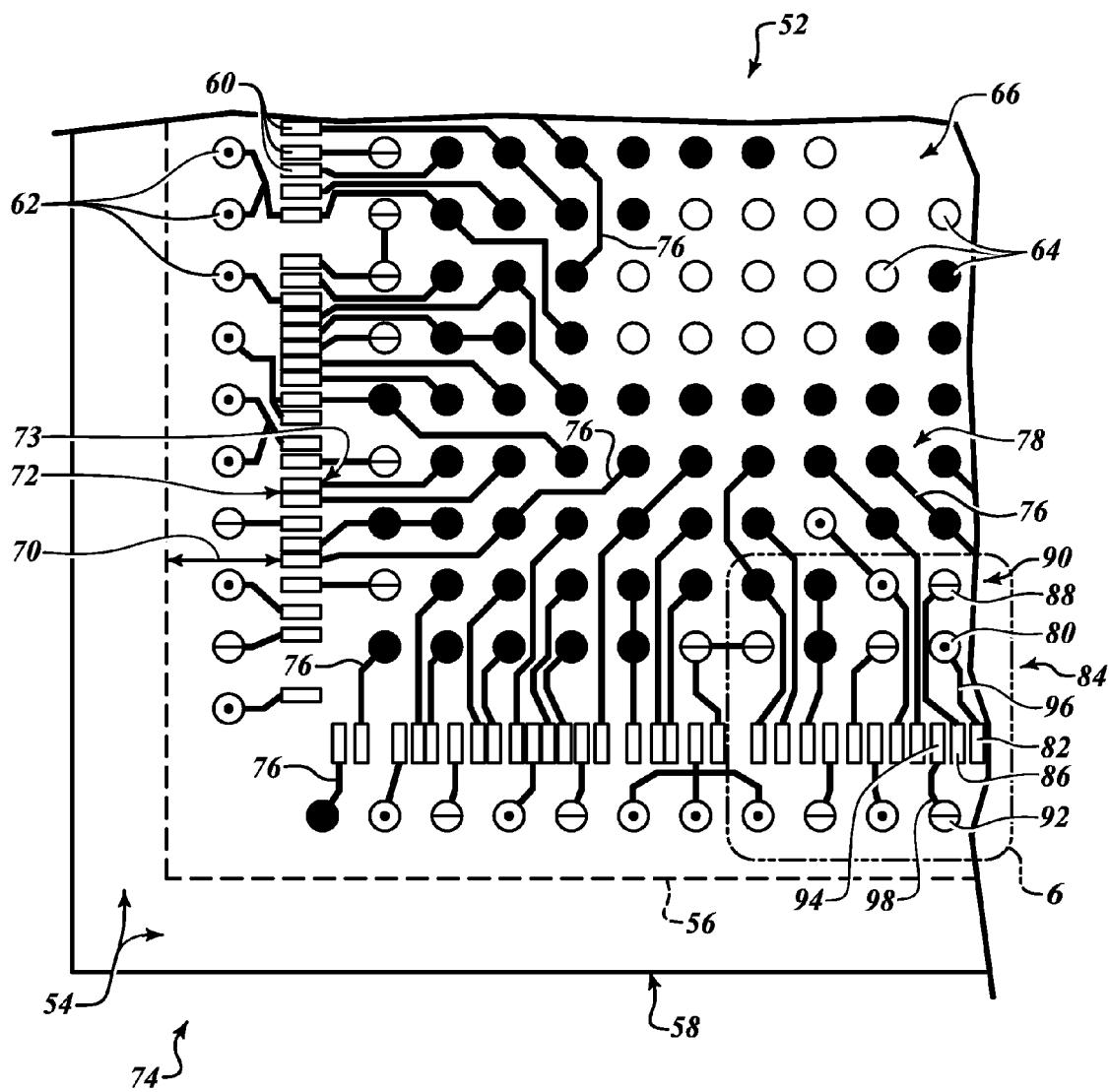
FIG. 5 is an enhanced view of a corner of the die of FIG. 4.

Forming the first plurality of bump pads 62 outside the exterior edge 72 of the I/O pads 60 and reducing the density of the array 68 of the second plurality of bump pads 64 reduces the complexity of routing to connect the first and second pluralities of bump pads 62, 64 to the I/O pads 60. FIG. 5 is an enhanced view of a first corner 74 of the die 52 with a plurality of routing lines 76 connecting the first and second pluralities of bump pads 62, 64 to the I/O pads 60.

Figure 7:
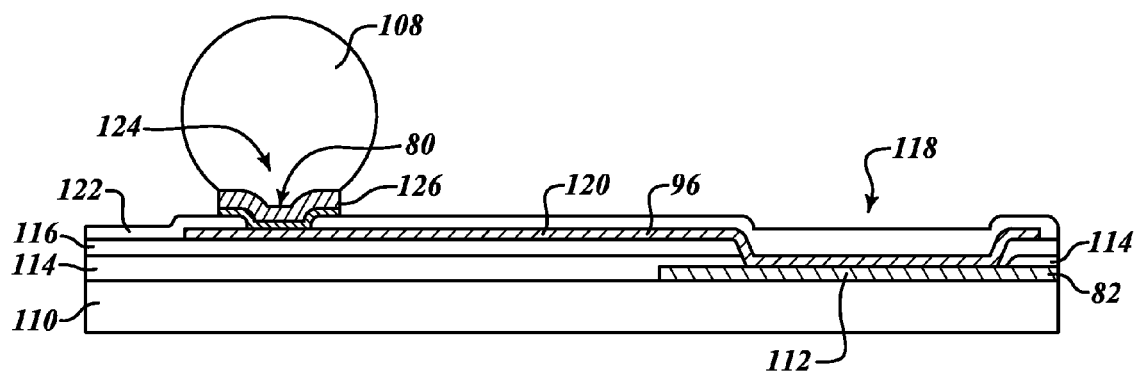
FIGS. 7 and 8 are cross-sectional views of contact pads, routing lines, and solder bumps of FIG. 6.
Figure 8:
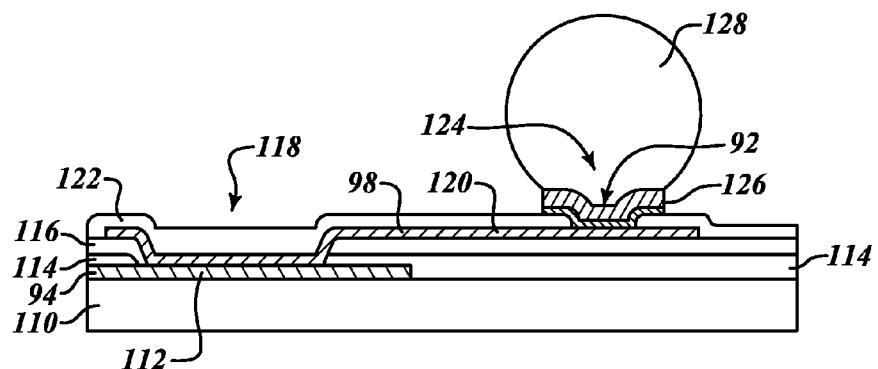

The routing lines 76 are formed in a redistribution layer 78, which is described in more detail with respect to FIGS. 7 and 8. FIG. 5 shows the I/O pads 60, the routing lines 76, and the first and second bump pads 62, 64 in a single plane or surface for illustrative purposes. FIGS. 7 and 8 address the how the I/O pads 60 are connected to the first and second bump pads 62, 64 with the routing lines 76.

In areas where the I/O pads 60 are less dense, a third plurality of bump pads 75 may be positioned over the I/O pads 60. Because the I/O pads 60 are less dense, the I/O pads 60 may be formed to be larger than in less dense areas, such as the area in FIG. 5. In this embodiment, the first plurality of bump pads 62 includes 32 bump pads between the die seal 56 and the exterior edge 72 of the I/O pads 60. The third plurality of bump pads 75 includes 30 bump pads. Some of the third bump pads 75 are unused in order to provide appropriate spacing for the routing lines for the other bump pads 75. Unused bump pads are depicted by an empty circle as indicated below.

The array 68 of the second plurality of bump pads 64 will have seven rows adjacent the larger I/O pads 60 if the third plurality of bump pads 75 are moved. This also reduces the density of the array 68, which allows for a reduction in the overall dimension of the die 52 or an increase in the spacing between bump pads. The first plurality of bump pads 62 adjacent the third plurality of bump pad 75 have similar bump pads grouped together to further reduce routing density. For example, a group of ground bump pads 77 are positioned in close proximity and can all be routed to one or two of the I/O pads.

In the Figures, the following symbols are used to indicate a signal for which each of the bump pads 62, 64 are assigned.

   Power
   Ground

 Data
○ Unused

Bump pads assigned to transmit power and ground signals are preferably positioned close to the I/O pads 60 to ensure shorter routing lines 76. The first plurality of bump pads 62 provides twice as many bump pads positioned close to the I/O pads 60. For example, in FIGS. 5 and 6 a first power bump pad 80 is positioned adjacent to a first I/O pad 82 in a first row 84 of the second plurality of bump pads 64. The first power bump pad 80 is closer to the first I/O pad 82 than any other bump pad, which makes routing simpler and avoids issues that arise long routing lines discussed above. The first power bump pad 80 is coupled to the first I/O pad 82 with a first routing line 96.

A second I/O pad 86 is routed to a first ground bump pad 88, which is in a second row 90. A second ground bump pad 92 from the first plurality of bump pads 62 is coupled to a third I/O pad 94 with a second routing line 98. In prior art devices, power and ground bump pads were generally positioned within the first three rows of bump pads spaced from the I/O pads. Any power or ground bumps past the first three rows face significantly increased risks of noise and voltage drop problems.

Figure 6:
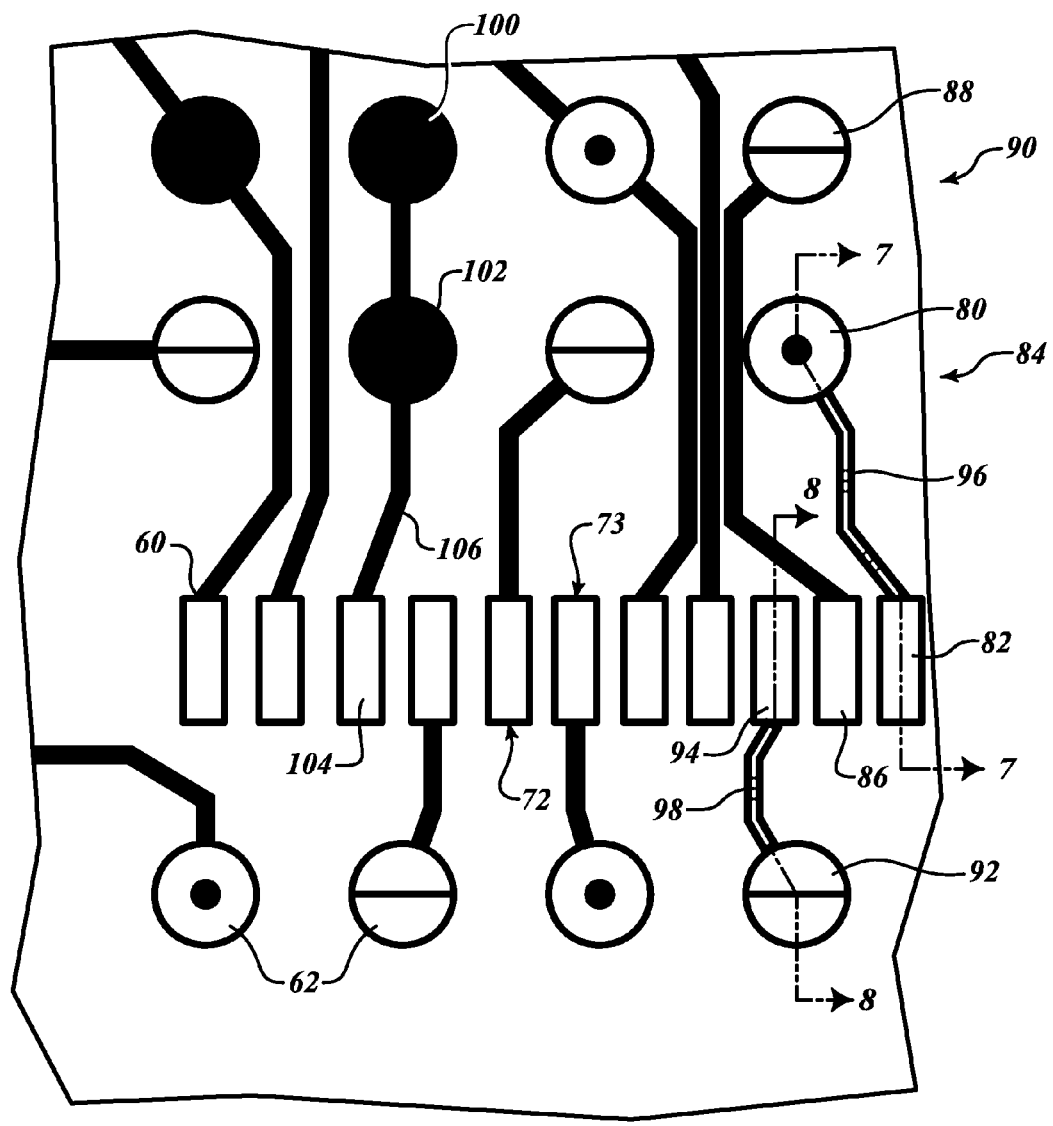
FIG. 6 is an enhanced view of a portion of the die of FIG. 5.

As seen in FIGS. 5 and 6, most of the power and ground bump pads are within one to two rows of the I/O path 60. Since power and ground can draw huge current, voltage drop is a concern. The present disclosure provides space on both sides of the I/O pads 60 for placement of the bump pads 62, 64, thereby increasing the number of power and ground bump pads that can be within one to two rows of the I/O pads 60. Having a shorter distance to travel lowers the risk of voltage drop.

This arrangement also reduces the density of the second plurality of bump pads 64 and allows an increase in spacing between adjacent bump pads 64. As with power and ground bumps, data signal bumps are also susceptible to problematic voltage drop if the routing lines are extended too far. Accordingly, it is advantageous when the data bumps are also relatively close to the I/O pads 60.

In FIG. 6, a first and a second data bump pad 100, 102 are coupled to a fourth I/O pad 104 by a third routing line 106. Having the first plurality of bump pads 62 between the I/O pads 60 and the chip outline boundary 58 allows the data bumps from the second plurality of bump pads 64 to be closer to the I/O pads 60.

Most of the I/O pads are assigned to the first plurality of bump pads 62 and ones of the second plurality of bump pads 64 in the first and second rows 84, 90. A significant number of the first plurality of bump pads 62 will be power and ground I/O pads and a significant number of the second plurality of bump pads 64 will be assigned to data signals. As mentioned above, some bump pads will be unused prior to routing and may be assigned during routing as needed. These unused bump pads may never be routed and will remain as dummy structures. Alternatively, the unused bumps may be directly connected to the power or ground of the substrate of the package and directly connect into the die 52.

FIG. 7 is a cross-sectional view of a first solder ball 108 coupled to the first power bump, which is coupled to the first I/O pad 82 via the first routing line 96. The first I/O pad 82 is formed on an integrated circuit 110, which includes a plurality of circuit components not shown. The first I/O pad 82 is formed from a top metal layer 112, such as metal 6. The top metal layer 112 is formed and then patterned to form the first I/O pad 82 and all of the other I/O pads 60. A first dielectric layer 114 is formed over the I/O pads 60. In one embodiment, the first dielectric layer is a nitride passivation layer. The first dielectric layer 114 overlaps and seals edge of the first I/O pad 82, thereby protecting the integrated circuit 110 below.

Then the redistribution layer 78 is formed to couple the I/O pads 60 to the plurality of bump pads 62, 64. The redistribution layer 78 is either formed with the top metal layer or with an extra metal layer. The redistribution layer 78 provides the electrical connections from the I/O pads 60 to the first and second pluralities of bump pads 62, 64. A second dielectric layer 116 is formed over the first dielectric layer 114. A plurality of first openings 118 are opened through the first and second dielectric layers 114, 116 to expose the I/O pads 60, including the first and second I/O pads 82, 112. In one embodiment, the second dielectric layer 116 is a polyimide.

Subsequently, a redistribution metal layer 120 is formed over the exposed I/O pads 60 and over the second dielectric layer 116. The redistribution metal layer 120 is patterned and etched to form the different routing lines 76, including the first and second routing lines 96, 98. The redistribution metal layer 120 may be a plurality of layers to have appropriate adhesion, barrier, and conductive properties. In one embodiment, the redistribution metal layer 120 may include, titanium, copper, and nickel. The redistribution metal layer 120 relocates the I/O pads 60 to the associated first or second bump pads 62, 64. In this embodiment there is only a single redistribution layer, however, multiple redistribution layers may be used as needed.

A third dielectric layer 122 is formed and patterned to protect the redistribution metal layer 120 and provides a plurality of second openings 124 for the bump pads 62, 64 to be formed. An under-bump metallization 126 is formed in the second openings 124 to provide the appropriate connections for the first solder ball 108. The same is true for FIG. 8 where the under-bump metallization 126 couples a second solder ball 128 to the third I/O pad 94. Accordingly, the I/O pads 60 are not visible from the plan view of FIGS. 4, 5, and 6 because they are covered by passivation or dielectric layers.

FIG. 9 is an enhanced view of one of the scribes lanes 54 between a third die 130 and a fourth die 132 from the wafer 50 of FIG. 3. Both the third and fourth die 130, 132 have the first plurality of bump pads 62 formed between the die seal 56 and the exterior edge 72 of the I/O pads 60. The third and fourth die 130, 132 also have the second plurality of bump pads 64 between the interior edge 73 of the I/O pads 60.

FIG. 10 is a cross-sectional view through a fifth I/O pad 134, a second power bump 136, and a third routing line 138 on the third die 130 and a sixth I/O pad 140, a third ground bump 142, and a fourth routing line 144 of the fourth die 132. The cross-section also extends through the die seal 56 of the third die 130 and the die seal 56 of the fourth die 132.

The die seal 56 includes stress relief structures and mechanical stress blockers to prevent mechanical effects from propagating into the die. In addition, the die seals 56 are positioned a certain distance from the first plurality of bump pads 63 to ensure mechanical and electrical defect do not propagate from the scribe lanes 54 into the die. These mechanical stresses can be particularly problematic at the corners. Accordingly, reducing the density of the bump pads at the corners aids in reducing these problems.

The chip outline boundary 58 of FIG. 4 is shown as a dashed line in FIG. 10 to illustrate where a saw may separate the die.

As mentioned above, the best routing scenario is when routing is achieved with shorter routing line lengths. The present disclosure provides for an extra row of bump pads that makes three to four rows of bump pads available for optimum routing. In particular, power bumps can be moved to the position of the first plurality of bump pads 62 to have short routing lines to the I/O pads 60. This additional row reduces the density of the second plurality of bump pads 64, especially in the corners where routing is more challenging. These shorter routing lines reduces voltage drop and provides better resistances for power supplies. The method of present disclosure can be utilized for logic chips, microprocessors, and other chips with partial to full arrays of bump pads for flip chip.

The various embodiments described above can be combined to provide further embodiments. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A die, comprising:
   a central region;
   a die seal spaced from the central region;
   a plurality of interconnection pads positioned between the central region and the die seal;
   a first plurality of bump pads positioned between the interconnection pads and the die seal, the first plurality of bump pads being configured to electrically couple a respective one of the plurality of interconnection pads to a package carrier; and
   a second plurality of bump pads positioned between the plurality of interconnection pads and the central region, the second plurality of bump pads being configured to electrically couple a respective one of the plurality of interconnection pads to the package carrier.

2. The die of claim 1 wherein the plurality of interconnection pads are formed in rows adjacent to the die seal.

3. The die of claim 2, further comprising a third plurality of bump pads positioned over at least one of the rows.

4. The die of claim 1, further comprising a plurality of routing lines that couple the interconnection pads to the first and second plurality of bump pads.

5. The die of claim 1 wherein the central region is free of bump pads.

6. The die of claim 1 wherein a majority of the first plurality of bump pads are assigned to power and ground.

7. A semiconductor die, comprising:
   a chip outline boundary;
   a die seal;
   a row of input/output contact pads separated from the chip outline boundary by the die seal;
   a first row of solder bump connections positioned between the row of input/output contact pads and the die seal, the first row of solder bump connections being configured to electrically couple a respective one of the plurality of input/output contact pads to a package carrier; and
   a second row of solder bump connections separated from the first row of solder bump connections by the row of input/output contact pads, the second row of solder bump connections being configured to electrically couple a respective one of the plurality of input/output contact pads to the package carrier.

8. The die of claim 7 wherein the first row of solder connections is spaced from the row input/output contact pads by a first distance and the second row of solder bump connections is spaced from the row of input/output contact pads by a second distance.

9. The die of claim 8 wherein the first distance is less than or equal to the second distance.

10. The die of claim 7 further comprising a third row of solder bump connections separated from the row of input/output contact pads by the second row of solder bump connections.

11. The die of claim 7 wherein a majority of the first row of solder bump connections are assigned to power and ground signals.

12. The die of claim 7 wherein a majority of the second row of solder bump connections are assigned to data signals.

13. A method, comprising:
   forming an integrated circuit on a substrate;
   forming a die seal around a periphery of the integrated circuit;
   forming a plurality of contact pads coupled to the integrated circuit and positioned adjacent to the periphery;
   forming a redistribution layer on the plurality of contact pads, the redistribution layer includes traces, each of the traces being configured to be in electrical communication with a respective one of the plurality of contact pads;
   forming a first plurality of solder pads on the redistribution layer, each of the first plurality of solder pads being configured to be in electrical communication with a respective one of the traces of the redistribution layer, the first plurality of solder pads positioned between the die seal and the plurality of contact pads; and
   forming a second plurality of solder pads on the redistribution layer, each of the second plurality of solder pads being configured to be in electrical communication with a respective one of the traces of the redistribution layer, the second plurality of solder pads separated from the first plurality of solder pads by the plurality of contact pads.

14. The method of claim 13, further comprising coupling the plurality of contact pads to the first plurality of solder pads and to the second plurality of solder pads through the redistribution layer.

15. The method of claim 13 wherein the second plurality of solder pads is an array of solder pads.

16. The method of claim 13 wherein the first plurality of solder pads is spaced from the plurality of contact pads by a first distance and the second plurality of solder pads is spaced from the plurality of contact pads by a second distance.

17. The method of claim 13 wherein the redistribution layer includes a plurality of routing lines that couple the plurality of contact pads to the first and second plurality of solder pads.

* * * * *